(12) United States Patent
Yang

(10) Patent No.: US 6,392,581 B1
(45) Date of Patent: May 21, 2002

(54) TUNING CIRCUIT FOR AN ANALOG-TO-DIGITAL CONVERTER

(75) Inventor: Neng-Tze Yang, Palos Verdes Estates, CA (US)

(73) Assignee: Hughes Electronics Corp., El Segundo, CA (US)

( * ) Notice: Subject to any disclaimer, the term of this patent is extended or adjusted under 35 U.S.C. 154(b) by 0 days.

(21) Appl. No.: 09/527,782

(22) Filed: Mar. 17, 2000

(51) Int. Cl.[7] ................................................. H03M 1/12
(52) U.S. Cl. ........................................ 341/155; 341/158
(58) Field of Search ................................. 341/155, 159, 341/133, 136, 158, 160

(56) References Cited

U.S. PATENT DOCUMENTS

| | | | | |
|---|---|---|---|---|
| 5,055,845 A | * | 10/1991 | Ridkosil | 341/155 |
| 5,134,403 A | * | 7/1992 | Rush | 341/159 |
| 5,345,237 A | * | 9/1994 | Kouno et al. | 341/156 |
| 5,416,484 A | * | 5/1995 | Lofstrom | 341/159 |
| 5,563,598 A | * | 10/1996 | Hickling | 341/155 |
| 5,699,010 A | * | 12/1997 | Hatanaka | 327/563 |
| 5,742,248 A | * | 4/1998 | Vorenkamp et al. | 341/156 |
| 5,757,234 A | * | 5/1998 | Lane | 330/256 |
| 5,877,718 A | * | 3/1999 | Andoh et al. | 341/155 |
| 5,945,935 A | * | 8/1999 | Kusumoto et al. | 341/159 |
| 6,018,262 A | * | 1/2000 | Noro et al. | 327/328 |

FOREIGN PATENT DOCUMENTS

| | | | | |
|---|---|---|---|---|
| JP | 03-026014 | * | 4/1991 | H04B/3/04 |

* cited by examiner

*Primary Examiner*—Tuan T. Lam
(74) *Attorney, Agent, or Firm*—Terje Gudmestad

(57) ABSTRACT

An analog-to-digital converter is used to convert a known analog signal to a digital output. The output is then compared to a known digital output that corresponds to the known analog signal. If the two do not match, then the gain and frequency response of the analog-to-digital converter is tuned using a varactor control circuit until the digital output is correct.

10 Claims, 2 Drawing Sheets

TUNING CIRCUIT FOR AN ANALOG-TO-DIGITAL CONVERTER

TECHNICAL FIELD

The present invention relates generally to analog-to-digital converters and more particularly to analog-to-digital having a tunable frequency response.

BACKGROUND ART

Currently, many products use analog-to-digital converter circuits. The reason for this is that microprocessors analyze and use only digital data. Analog-to-digital converters are, therefore, necessary to convert electrical analog data to digital data.

As the need to convert analog data to digital data has increased, analog-to-digital converter circuits have become more sophisticated. Typical analog-to-digital converter circuits are no longer comprised of individual discrete components, but are instead comprised of integrated circuits and are capable of greater speed, resolution and accuracy.

A typical high-speed high-performance analog-to-digital converter has several components. These components include a track and hold circuit for sampling the analog input at a given clock rate, a large number of amplifiers for amplifying the input signal, a comparator to detect the level of the amplified signal and an encoder to convert the signal to a digital output. The accuracy of the analog-to-digital circuit is directly related to matching the gain and frequency response of the amplifiers to the clock rate and the comparator.

Unfortunately, it is hard to predict the performance of integrated circuits with accuracy, particularly mixed (digital and analog) signal integrated circuits that lack precision models for interconnection parasitic losses. The problem can increase due to intrinsic process variations within each integrated circuit wafer, from wafer-to-wafer, and lot-to-lot. It would, therefore, be desirable to fabricate each integrated circuit amplifier with the correct frequency response.

Matching the gain and frequency response to the clock rate and the comparator, however, can be quite difficult in an integrated circuit, particularly since they are difficult to modify after the fabrication process. Also, as the sampling frequency is increased, an incorrect amplifier frequency response will have a proportionately larger impact on overall accuracy. In satellite communication applications, typical sampling frequencies are in the multi-gigahertz range. Therefore, if the frequency response could be tuned after the integrated circuit was fabricated, many of the above issues could be solved.

SUMMARY OF THE INVENTION

It is, therefore, an object of the invention to provide an improved and reliable analog-to-digital converter circuit. Another object of the invention is to provide an analog-to-digital converter circuit with an adjustable gain and frequency response.

In one aspect of the invention, a circuit includes an analog-to-digital converter. The analog-to-digital converter has an amplifier circuit whose gain and frequency response are controlled by a varactor control circuit.

In a further aspect of the invention, an analog-to-digital converter is used to convert an analog signal to a digital signal. A track and hold core circuit samples and holds the analog signal at a predetermined clock frequency to generate a sampled analog signal. A track and hold buffer circuit then amplifies the sampled analog signal by an amount enhanced by a first varactor control circuit to produce a first amplified signal. Two or more preamplifier circuits further amplify the first amplified analog signal by an amount enhanced by a second varactor control circuit to produce a second amplified signal. The level of the second amplified signal is then determined by a comparator and converted to a binary output by an encoder.

The present invention thus achieves an improved analog-to-digital converter circuit with an adjustable gain and frequency response. The present invention is advantageous in that it improves circuit performance while increasing the overall production yield when compared to conventional technology.

Additional advantages and features of the present invention will become apparent from the description that follows, and may be realized by means of the instrumentalities and combinations particularly pointed out in the appended claims, taken in conjunction with the accompanying drawings.

BRIEF DESCRIPTION OF THE DRAWINGS

In order that the invention may be well understood, there will now be described some embodiments thereof, given by way of example, reference being made to the accompanying drawings, in which.

BEST MODES FOR CARRYING OUT THE INVENTION

Figure 1:
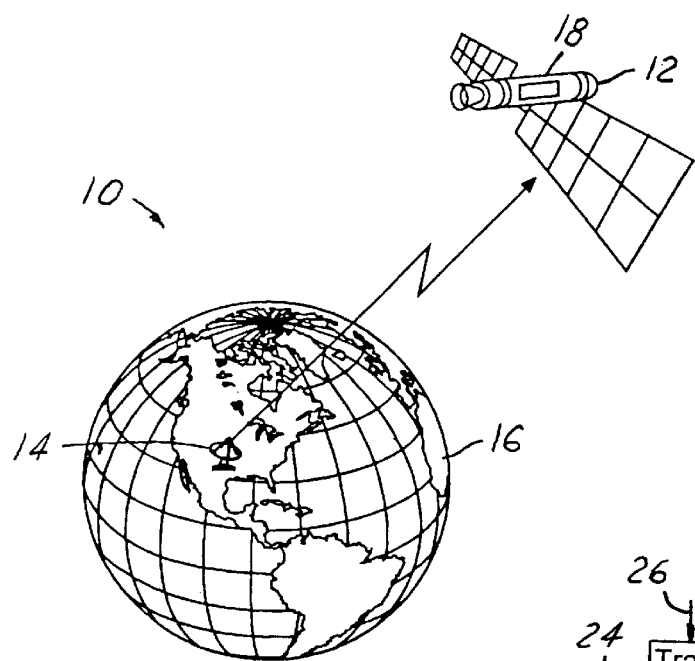
FIG. 1 is a perspective view of a satellite communications system.

Referring to FIG. 1, a satellite communications system 10 according to one embodiment of the present invention is illustrated. The satellite communications system 10 is comprised of a satellite 12 in communication with a ground station 14 located on the Earth 16. Satellite 10 contains a circuit 18 for converting an analog signal to a digital signal.

Figure 2:
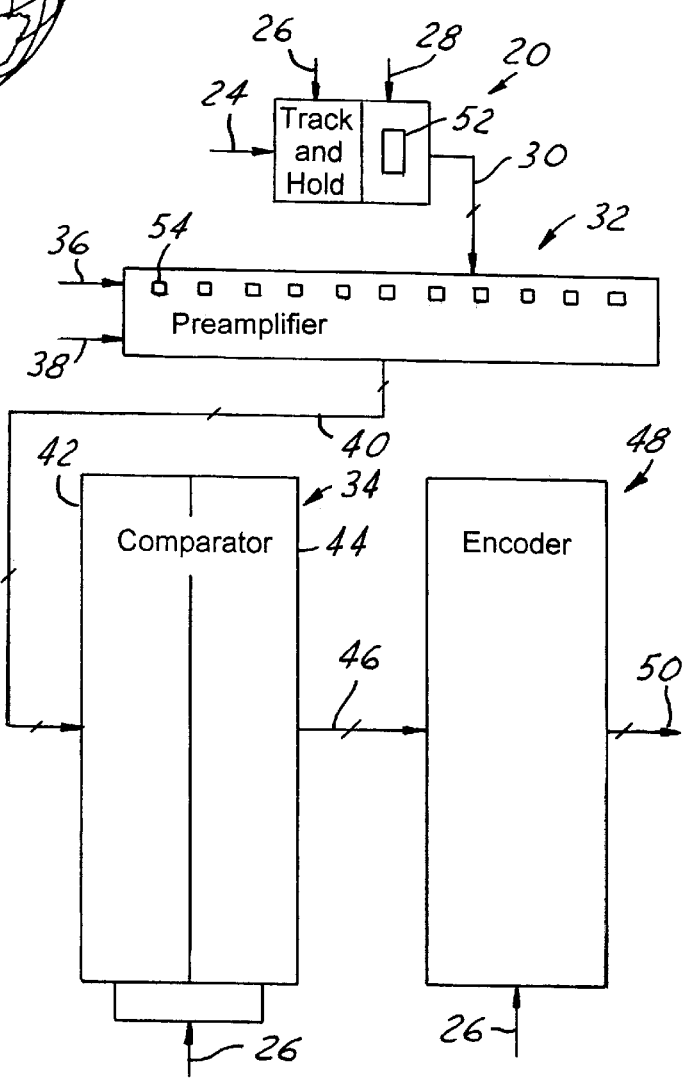
FIG. 2 is a block diagram of an analog-to digital converter in accordance with the present invention.

Referring to FIG. 2, a block diagram of an analog-to-digital converter circuit 18 in accordance with the present invention is illustrated. Circuit 18 is an analog-to-digital converter that is used to convert an analog signal into a digital signal. Analog-to-digital converter 18 includes a track and hold circuit 20, a preamplifier 32, a comparator 42, and an encoder 48.

Track and hold circuit 20 samples the analog signal and maintains that signal level between samples to generate a first analog signal. Track and hold circuit 20 includes an analog input 24 for receiving the analog signal, a clock-input frequency 26 that determines the sampling rate, a first varactor control input 28 for tuning the gain and frequency response of track and hold circuit 20, and a first analog output 30. In the present embodiment, clock-input frequency 26 is in the multi-gigahertz range and the final stage of track and hold circuit 20 comprises first varactor control circuit 28.

Preamplifier 32 is coupled to first analog output 30 and amplifies the first analog signal to generate a second analog signal. Preamplifier 32 includes a voltage reference input 38, a second varactor control input for tuning the gain and frequency response of preamplifier 32 and a second analog output 40. In the present embodiment, preamplifier 32 comprises thirty-two second varactor control circuits 54 generating thirty-two second analog signals.

Comparator 34 is coupled to second analog output 40. Comparator 34 detects and latches the level of the second analog signal to generate a first digital signal. Comparator 42 includes a first 42 and second latch 44 for maintaining a first digital output 46. Comparator 42 also includes clock-input frequency 26 that determines latching frequency. In the present embodiment, comparator 34 comprises sixty-three comparator circuits (not shown) to determine the level of the thirty-two second analog signals and thirty-one second analog signal averages to generate sixty-three first digital signals.

Encoder 48 is coupled to digital output 46 and encodes the first digital signal to generate a second digital signal. Encoder 48 includes a clock frequency input 26 that determines encoding frequency and a second digital output 50. In the present embodiment, encoder 48 encodes the sixty-three first digital signals to generate 6-bit second digital signal.

Figure 3A:
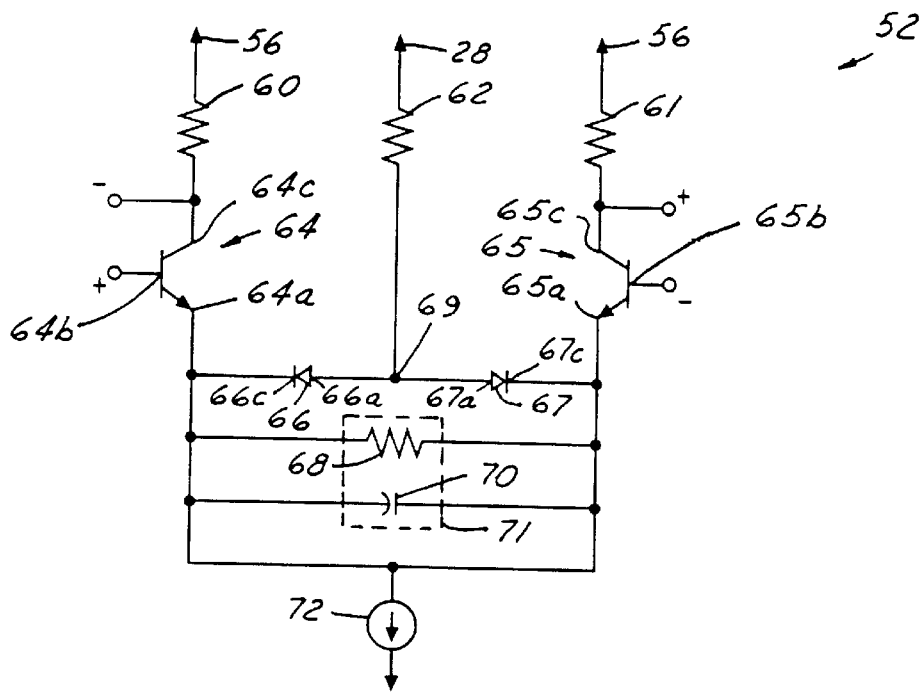
FIG. 3A is a circuit diagram of a first varactor control circuit in accordance with the present invention.

Referring to FIG. 3A, a circuit diagram of a first varactor control circuit 52 in accordance with the present invention is illustrated. First varactor control circuit 52 comprises a pair of matched first transistors 64, 65, each having a base or input terminal 64b, 65b, an emitter or control terminal 64a, 65a, and a collector or output terminal 64c, 65c, respectively. The collectors 64c, 65c are coupled to a collector voltage 56 through a set of first resistors 60, 61. The emitters 64a, 65a are coupled directly to a first constant current source 72. A series feedback loop 71 is coupled between emitter 64a and emitter 65a comprising a second resistor 68 in parallel with a first capacitor 70. Additionally, two first varactors 66, 67 are coupled in series between emitter 64a and emitter 65a, such that first varactor anodes 66a and 67a are coupled to each other and the first varactor cathodes 66c, 67c are coupled to separate emitters 64a, 65a. The common node formed by varactor anodes 66a, 67a is coupled to a first varactor control input 28 through a third resistor 62.

Functionally, the above-described circuit, is a differential amplifier that amplifies a voltage difference applied between transistor base 64b and transistor base 65b. The DC gain of the amplifier is proportional to the ratio of first resistor 61 to second resistor 68. The output voltage is from transistor collectors 64c, 65c. First capacitor 70 determines the high frequency response of the differential amplifier, while the capacitance of first varactors 66, 67 enhances the high frequency response. The capacitance of first varactors 66, 67 are controlled by a DC voltage applied to first varactor control input 28. When the capacitance of first varactors 66, 67 decrease as a result of the DC voltage decreasing, the high frequency gain of circuit 52 reduces accordingly. In this way the frequency response of the track and hold circuit can be tuned.

Figure 3B:
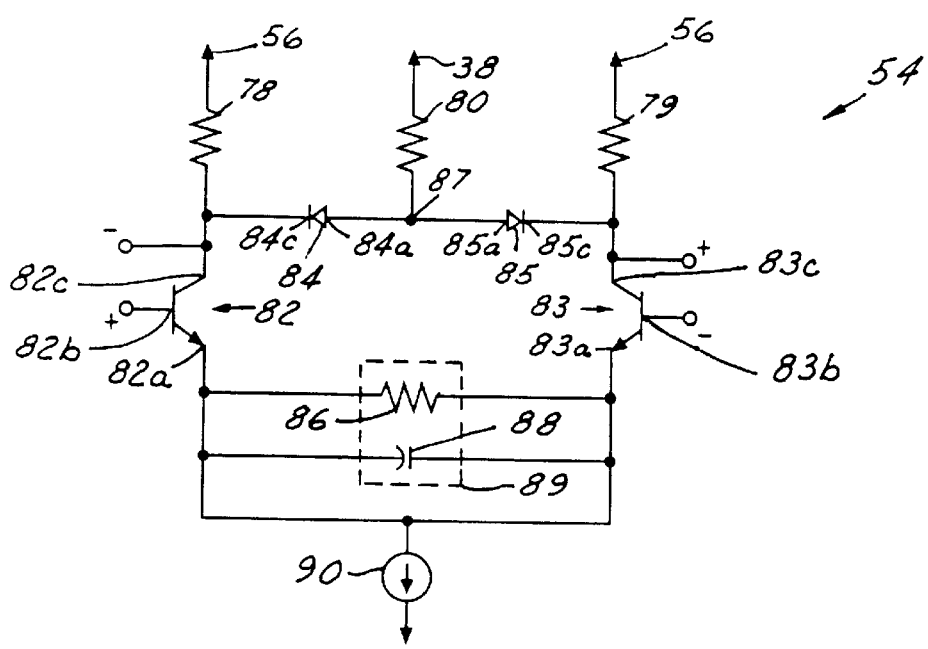
FIG. 3B is a circuit diagram of a second varactor control circuit in accordance with the present invention.

Referring to FIG. 3B, a circuit diagram of a second varactor control circuit 54 in accordance with the present invention is illustrated. Second varactor control circuit 54 comprises a pair of matched second transistors 82, 83, each having a base or input terminal 82b, 83b, an emitter or control terminal 82a, 83a, and a collector or output terminal 82c, 83c, respectively. The collectors 82c, 83c are coupled to a collector voltage 56 through a set of first resistors 78, 79. The emitters 82a, 83b are coupled directly to a second constant current source 90. A series feedback loop 89 is coupled between emitter 82a and emitter 83a comprising a forth resistor 86 in parallel with a second capacitor 88.

Additionally, two second varactors 84, 85 are coupled in parallel between collector 82c and collector 83c, such that second varactor anode 84a and anode 85a are coupled to each other and the second varactor cathodes 84c, 85c are coupled to separate collectors 82a, 83a. The common node 87 formed by varactor anodes 84a, 85a is coupled to a second varactor control input 38 through a sixth resistor 80.

Functionally, the above-described circuit, is a differential amplifier that amplifies a voltage difference applied between transistor base 82b and transistor base 83b. The DC gain of the amplifier is proportional to the ratio of forth resistor 79 to fifth resistor 86. The output voltage is from transistor collectors 82c, 83c. First capacitor 88 determines the high frequency response of the differential amplifier, while the capacitance of first varactors 84, 85 enhances the high frequency response. The capacitance of second varactors 84, 85 are controlled by a DC voltage applied to second varactor control input 38. When the capacitance of second varactors 84, 85 decrease as a result of the DC voltage decreasing, the high frequency gain of circuit 54 increases accordingly. In this way the frequency response of the preamplifier can be tuned.

In operation, an analog-to-digital converter is used to convert an analog signal to a digital signal. First, a track and hold circuit 20 samples and holds an analog signal at a constant level. The rate of sampling is determined by a clock frequency and is used to generate a sampled analog signal. In the present example, the clock frequency is in the multi-gigahertz range.

Next, a first varactor control circuit 52 amplifies the difference between the sampled analog signal and ground. The frequency response and amount of amplification is determined by series feedback loop 71 in conjunction with a pair of first varactors 66, 67 to generate a first analog signal. The first analog signals are taken from both the non-inverting and inverting output terminals of circuit 52 also called collectors 65c and 64c respectively.

Thirty-two second varactor control circuits 54 then further amplify the difference between the first amplified analog signal and thirty-two incremental voltage references 38. The frequency response and amount of amplification of each circuit 54 is determined by a series feed back loop 89 in conjunction with a pair of second varactors 84,85 to generate a second analog signal. Thirty-two second analog signals are taken from both the non-inverting and inverting output terminals of circuits 54 also called collectors 83c and 82c respectively.

The comparator 34 then generates thirty-one averages of the thirty-two second analog signals to generate sixty-three intermediate second analog signals. Sixty-three individual comparator circuits (not shown) then track and latch the sixty-three second analog signals to generate sixty-three first digital signals. The encoder 34 then converts the sixty-three first digital signals to 6-bit second digital signal.

In the present embodiment, both track and hold circuit 20 and preamplifier 32 are tuned using separate varactor control circuits. First analog output 30 of track and hold circuit 20 is compared to a known first analog output that corresponds to the known analog signal. If the two do not match, then the voltage on first varactor control input 28 is varied until the first analog output 30 is correct. Similarly, second analog output 40 is compared to a known second analog output that corresponds to the known analog signal. If the two do not match, then the voltage on the second varactor control input 36 is varied until the second analog output 40 is correct.

From the foregoing, it can be seen that there has been brought to the art a new and improved analog-to-digital converter. It is to be understood that the preceding description of the preferred embodiment is merely illustrative of some of the many specific embodiments that represent applications of the principles of the present invention. Clearly, numerous and other arrangements would be evident to those skilled in the art without departing from the scope of the invention as defined by the following claims.

What is claimed is:

1. An analog to digital converter circuit, comprising:
   an amplifier circuit, said amplifier circuit having a gain and a frequency response, said amplifier circuit having a varactor control circuit controlling said gain and said frequency response,
   an analog input;
   a track and hold circuit coupled to said analog input, said track and hold circuit having a clock-input frequency and a first analog output;
   wherein said amplifier circuit is in between said track and hold circuit and a preamplifier, said preamplifier having a voltage reference and a plurality of second analog outputs;
   a comparator coupled to said preamplifier and receiving said second analog outputs, said comparator having the clock-input frequency and a first digital output; and
   an encoder coupled to said comparator and receiving said first digital output, said encoder having the clock-input frequency and a second digital output.

2. A circuit as recited in claim 1, wherein said varactor control circuit forms a series feedback element within said amplifier circuit.

3. A circuit as recited in claim 2, wherein said amplifier circuit comprises a differential amplifier circuit.

4. A circuit as recited in claim 3, wherein said differential amplifier circuit further comprises:
   a first transistor having a first control terminal, a first input terminal and a first output terminal;
   a second transistor having a second control terminal, a second input terminal and a second output terminal;
   a first varactor having a first cathode and a first anode, said first cathode coupled to said first control terminal;
   a second varactor having a second cathode and a second anode, said second cathode coupled to said second control terminal and said second anode coupled to said first anode; and
   a varactor control input coupled to said first anode and said second anode to control a capacitance of said first varactor and said second varactor.

5. A circuit as recited in claim 3, wherein said differential amplifier circuit further comprises:
   a first transistor having a first control terminal, a first input terminal and a first output terminal;
   a second transistor having a second control terminal, a second input terminal and a second output terminal;
   a first varactor having a first cathode and a first anode, said first cathode coupled to said first output terminal;
   a second varactor having a second cathode and a second anode, said second cathode coupled to said second output terminal and said second anode coupled to said first anode; and
   a varactor control input coupled to said first anode and said second anode to control a capacitance of said first varactor and said second varactor.

6. A satellite communications system comprising:
   a ground station;
   a satellite in orbit and in communication with said ground station, said satellite having an antenna for receiving an analog signal; and
   an analog to digital converter for converting said analog signal to a digital signal, said analog to digital converter having an amplifier circuit, said amplifier circuit having a gain and a frequency response, said amplifier circuit having a varactor control circuit controlling said gain and said frequency response,
   an analog input;
   a track and hold circuit coupled to said analog input, said track and hold circuit having a clock-input frequency and a first analog output;
   wherein said amplifier circuit is in between said track and hold circuit and a preamplifier, said preamplifier having a voltage reference and a plurality of second analog outputs;
   a comparator coupled to said preamplifier and receiving said second analog outputs, said comparator having said clock-input frequency and a first digital output; and
   an encoder coupled to said comparator and receiving said first digital output, said encoder having said clock-input frequency and a second digital output.

7. A satellite communications system as recited in claim 6, wherein said varactor control circuit forms a series feedback element within said amplifier circuit.

8. A satellite communications system as recited in claim 7, wherein said amplifier circuit comprises a differential amplifier circuit.

9. A satellite communications system as recited in claim 8, wherein said differential amplifier circuit further comprises:
   a first transistor having a first control terminal, a first input terminal and a first output terminal;
   a second transistor having a second control terminal, a second input terminal and a second output terminal;
   a first varactor having a first cathode and a first anode, said first cathode coupled to said first control terminal;
   a second varactor having a second cathode and a second anode, said second cathode coupled to said second control terminal and said second anode coupled to said first anode; and
   a varactor control input coupled to said first anode and said second anode to control a capacitance of said first varactor and said second varactor.

10. A satellite communications system as recited in claim 9, wherein said differential amplifier circuit further comprises:
    a first transistor having a first control terminal, a first input terminal and a first output terminal;
    a second transistor having a second control terminal, a second input terminal and a second output terminal;
    a first varactor having a first cathode and a first anode, said first cathode coupled to said first output terminal;
    a second varactor having a second cathode and a second anode, said second cathode coupled to said second output terminal and said second anode coupled to said first anode; and
    a varactor control input coupled to said first anode and said second anode to control a capacitance of said first varactor and said second varactor.

* * * * *